United States Patent
Maejima et al.

(10) Patent No.: US 9,105,335 B2
(45) Date of Patent: Aug. 11, 2015

(54) SEMICONDUCTOR MEMORY DEVICE

(71) Applicant: KABUSHIKI KAISHA TOSHIBA, Minato-ku (JP)

(72) Inventors: Hiroshi Maejima, Tokyo (JP); Koji Hosono, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/460,189

(22) Filed: Aug. 14, 2014

(65) Prior Publication Data

US 2014/0355349 A1 Dec. 4, 2014

Related U.S. Application Data

(63) Continuation of application No. 13/424,812, filed on Mar. 20, 2012, now Pat. No. 8,830,751.

(30) Foreign Application Priority Data

Sep. 7, 2011 (JP) .................. 2011-195018

(51) Int. Cl.
| | |
|---|---|
| G11C 11/34 | (2006.01) |
| G11C 16/04 | (2006.01) |
| G11C 16/10 | (2006.01) |
| G11C 16/06 | (2006.01) |
| G11C 16/08 | (2006.01) |
| G11C 16/34 | (2006.01) |
| H01L 27/088 | (2006.01) |
| H01L 27/115 | (2006.01) |
| H01L 21/8234 | (2006.01) |

(52) U.S. Cl.
CPC ............ *G11C 16/0483* (2013.01); *G11C 16/06* (2013.01); *G11C 16/08* (2013.01); *G11C 16/10* (2013.01); *G11C 16/3418* (2013.01); *H01L 27/088* (2013.01); *H01L 27/1157* (2013.01); *H01L 27/11573* (2013.01); *H01L 27/11582* (2013.01); *H01L 21/823493* (2013.01)

(58) Field of Classification Search
CPC ....... G11C 16/0483; G11C 16/08; G11C 8/08
USPC .............. 365/185.05, 185.17, 185.23, 185.11
See application file for complete search history.

(56) References Cited

U.S. PATENT DOCUMENTS

| | | | |
|---|---|---|---|
| 5,896,317 | A | 4/1999 | Ishii et al. |
| 6,141,250 | A | 10/2000 | Kashimura |

(Continued)

FOREIGN PATENT DOCUMENTS

| | | |
|---|---|---|
| JP | 2-223097 | 9/1990 |
| JP | 2005-71422 | 3/2005 |

*Primary Examiner* — Viet Q Nguyen
(74) *Attorney, Agent, or Firm* — Oblon, McClelland, Maier & Neustadt, L.L.P.

(57) ABSTRACT

According to one embodiment, a semiconductor memory device includes a memory cells, a selection transistor, a memory string, a block, and a transfer circuit. The memory cells are stacked on a semiconductor substrate. In the memory string, the memory cells and the selection transistor are connected in series. The block includes a plurality of memory strings. In data write and read, the transfer circuit transfers a positive voltage to a select gate line associated with a selected memory string in a selected block, and a negative voltage to a select gate line associated with an unselected memory string in the selected block, and to a select gate line associated with an unselected block.

16 Claims, 13 Drawing Sheets

(56) References Cited

U.S. PATENT DOCUMENTS

| | | |
|---|---|---|
| 6,411,548 B1 | 6/2002 | Sakui et al. |
| 6,819,592 B2 * | 11/2004 | Noguchi et al. ......... 365/185.17 |
| 6,850,439 B1 * | 2/2005 | Tanaka .................... 365/185.17 |
| 6,961,268 B2 | 11/2005 | Umezawa |
| 7,005,350 B2 | 2/2006 | Walker et al. |
| 7,006,379 B2 * | 2/2006 | Noguchi et al. ......... 365/185.17 |
| 7,091,890 B1 | 8/2006 | Sasaki et al. |
| 7,286,403 B2 | 10/2007 | Maejima |
| 7,387,935 B2 | 6/2008 | Masuoka et al. |
| 7,411,834 B2 * | 8/2008 | Kusakabe et al. ........ 365/185.23 |
| 7,558,117 B2 | 7/2009 | Maejima et al. |
| 7,696,559 B2 | 4/2010 | Arai et al. |
| 7,821,058 B2 | 10/2010 | Kidoh et al. |
| 7,859,902 B2 | 12/2010 | Maejima |
| 7,940,572 B2 * | 5/2011 | Kim ......................... 365/185.29 |
| 8,048,741 B2 | 11/2011 | Arai et al. |
| 8,102,711 B2 | 1/2012 | Maejima |
| 8,107,286 B2 | 1/2012 | Itagaki et al. |
| 8,243,518 B2 * | 8/2012 | Oh et al. .................. 365/185.18 |
| 8,339,856 B2 * | 12/2012 | Iwata ....................... 365/185.17 |
| 8,379,449 B2 | 2/2013 | Maejima |
| 8,427,874 B2 * | 4/2013 | Kato ........................ 365/185.11 |
| 8,493,789 B2 | 7/2013 | Yoon et al. |
| 8,830,751 B2 * | 9/2014 | Maejima et al. ......... 365/185.11 |
| 8,958,247 B2 * | 2/2015 | Asaoka et al. ........... 365/185.17 |
| 2003/0214842 A1 | 11/2003 | Jeong |
| 2006/0003541 A1 | 1/2006 | Choi et al. |
| 2008/0112211 A1 | 5/2008 | Toda |
| 2009/0268522 A1 | 10/2009 | Maejima |
| 2010/0097858 A1 | 4/2010 | Tokiwa et al. |
| 2010/0133627 A1 | 6/2010 | Mizukami et al. |
| 2011/0051520 A1 | 3/2011 | Kim |
| 2012/0044771 A1 | 2/2012 | Joo |

* cited by examiner

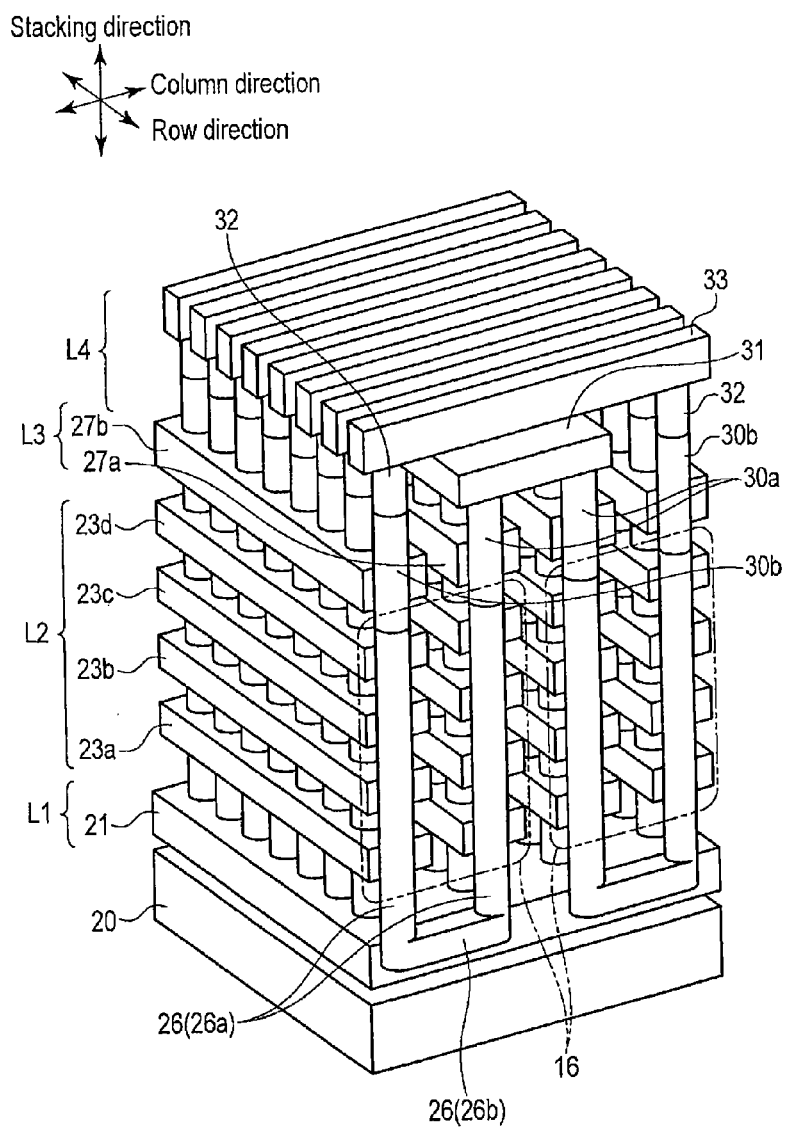
F I G. 3

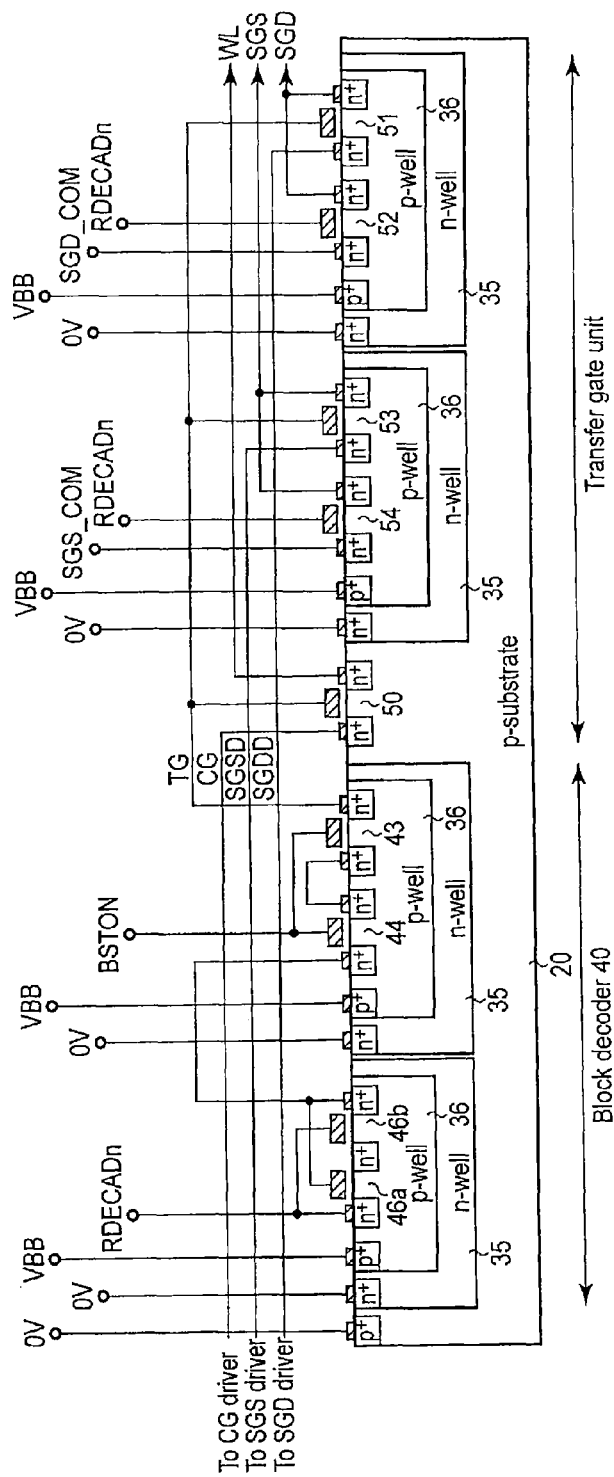
F I G. 7

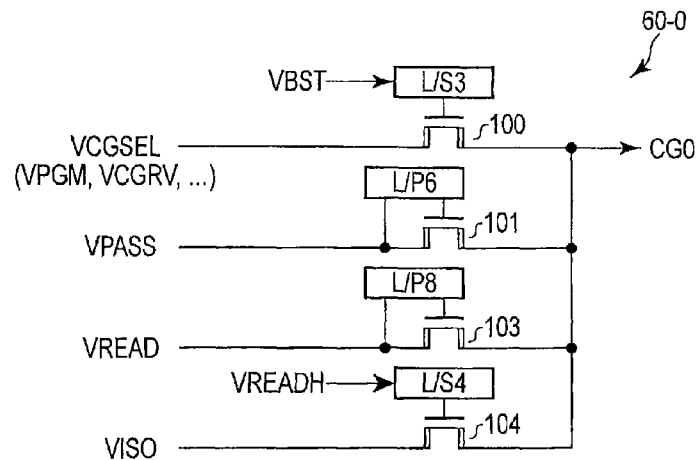
F I G. 10
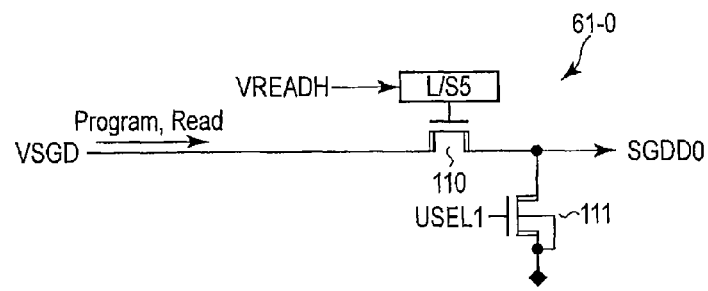
F I G. 11
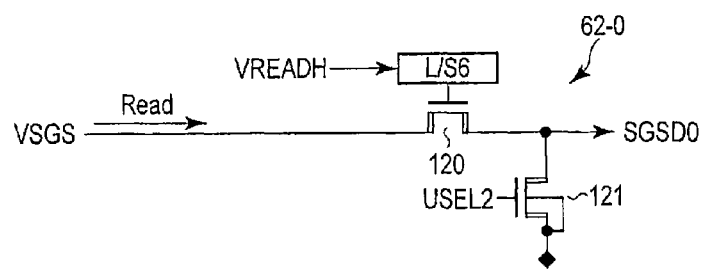
F I G. 12

SEMICONDUCTOR MEMORY DEVICE

CROSS-REFERENCE TO RELATED APPLICATIONS

This application is a continuation of U.S. application Ser. No. 13/424,812 filed Mar. 20, 2012, and is based upon and claims the benefit of priority from prior Japanese Patent Application No. 2011-195018, filed Sep. 7, 2011, the entire contents of each of which are incorporated herein by reference.

FIELD

Embodiments described herein relate generally to a semiconductor memory device.

BACKGROUND

A NAND flash memory in which memory cells are three-dimensionally arranged is known.

BRIEF DESCRIPTION OF THE DRAWINGS

FIGS. 2, 3, and 4 are a circuit diagram, perspective view, and sectional view, respectively, of a memory cell array according to the first embodiment;

FIG. 7 is a sectional view of the row decoder according to the first embodiment;

FIGS. 10, 11, and 12 are circuit diagrams of a CG driver, SGD driver, and SGS driver, respectively, according to the first embodiment;

DETAILED DESCRIPTION

In general, according to one embodiment, a semiconductor memory device includes: a memory cells; a selection transistor; a memory string; a block; a word line; a select gate line; a bit line; and a transfer circuit. The memory cells are stacked on a semiconductor substrate, and include a charge accumulation layer and control gate. In the memory string, the current paths of the memory cells and the selection transistor are connected in series. The block includes a plurality of memory strings. The word line is coupled to the control gate of the memory cell. The select gate line is coupled to the gate of the selection transistor. The bit line is coupled to one of the memory cells via the current path of the selection transistor. In data write and read, the transfer circuit transfers a positive voltage to a select gate line associated with a selected memory string in a selected block, and a negative voltage to a select gate line associated with an unselected memory string in the selected block, and to a select gate line associated with an unselected block.

[First Embodiment]

A semiconductor memory device according to the first embodiment will be explained below. This semiconductor memory device will be explained by taking, as an example, a three-dimensionally stacked NAND flash memory in which memory cells are stacked above a semiconductor substrate.

1. Arrangement of Semiconductor Memory Device

First, the arrangement of the semiconductor memory device according to this embodiment will be explained.

1.1 Overall Arrangement of Semiconductor Memory Device

Figure 1:
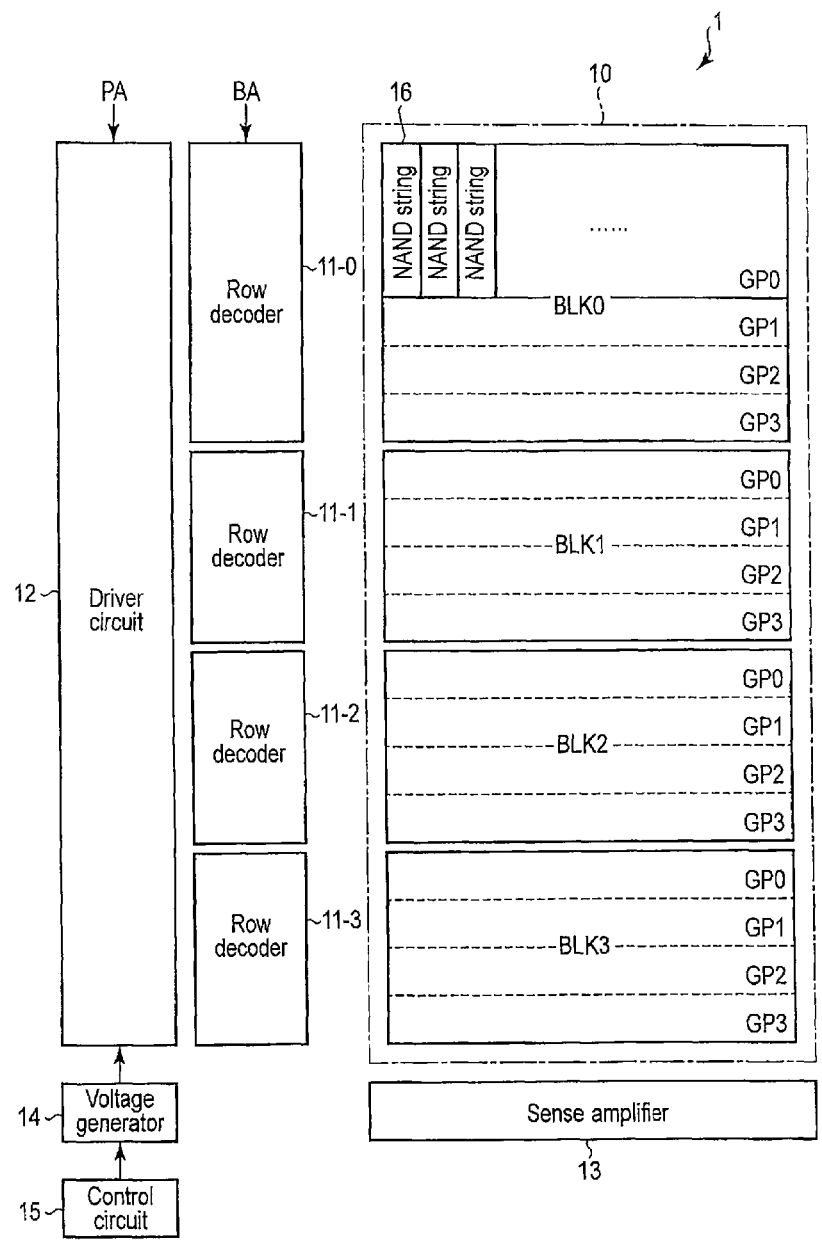
FIG. 1 is a block diagram of a semiconductor memory device according to the first embodiment.

FIG. 1 is a block diagram of the semiconductor memory device according to this embodiment. As shown in FIG. 1, a NAND flash memory 1 includes a memory cell array 10, row decoders 11 (11-0 to 11-3), a driver circuit 12, a sense amplifier 13, a voltage generator 14, and a control circuit 15.

The memory cell array 10 includes a plurality of (in this embodiment, four) blocks BLK (BLK0 to BLK3) each of which is a set of nonvolatile memory cells. Data in the same block BLK is erased at once. Each block BLK includes a plurality of (in this embodiment, four) memory groups GP (GP0 to GP3) each of which is a set of NAND strings 16 in which memory cells are connected in series. The number of blocks in the memory cell array 10 and the number of memory groups in the block BLK are, of course, arbitrary numbers.

The row decoders 11-0, 11-1, 11-2, and 11-3 respectively associated with the blocks BLK0, BLK1, BLK2, and BLK3, and each select the row direction of an associated block BLK.

The driver circuit 12 applies voltages necessary for data write, read, and erase to the row decoders 11. The row decoders 11 apply these voltages to memory cells.

In data read, the sense amplifier senses and amplifies data read out from a memory cell. In data write, the sense amplifier transfers write data to a memory cell.

The voltage generator 14 generates the voltages necessary for data write, read, and erase, and applies these voltages to the driver circuit 12.

The control circuit 15 controls the operation of the whole NAND flash memory.

1.2 Memory Cell Array 10

Figure 2:
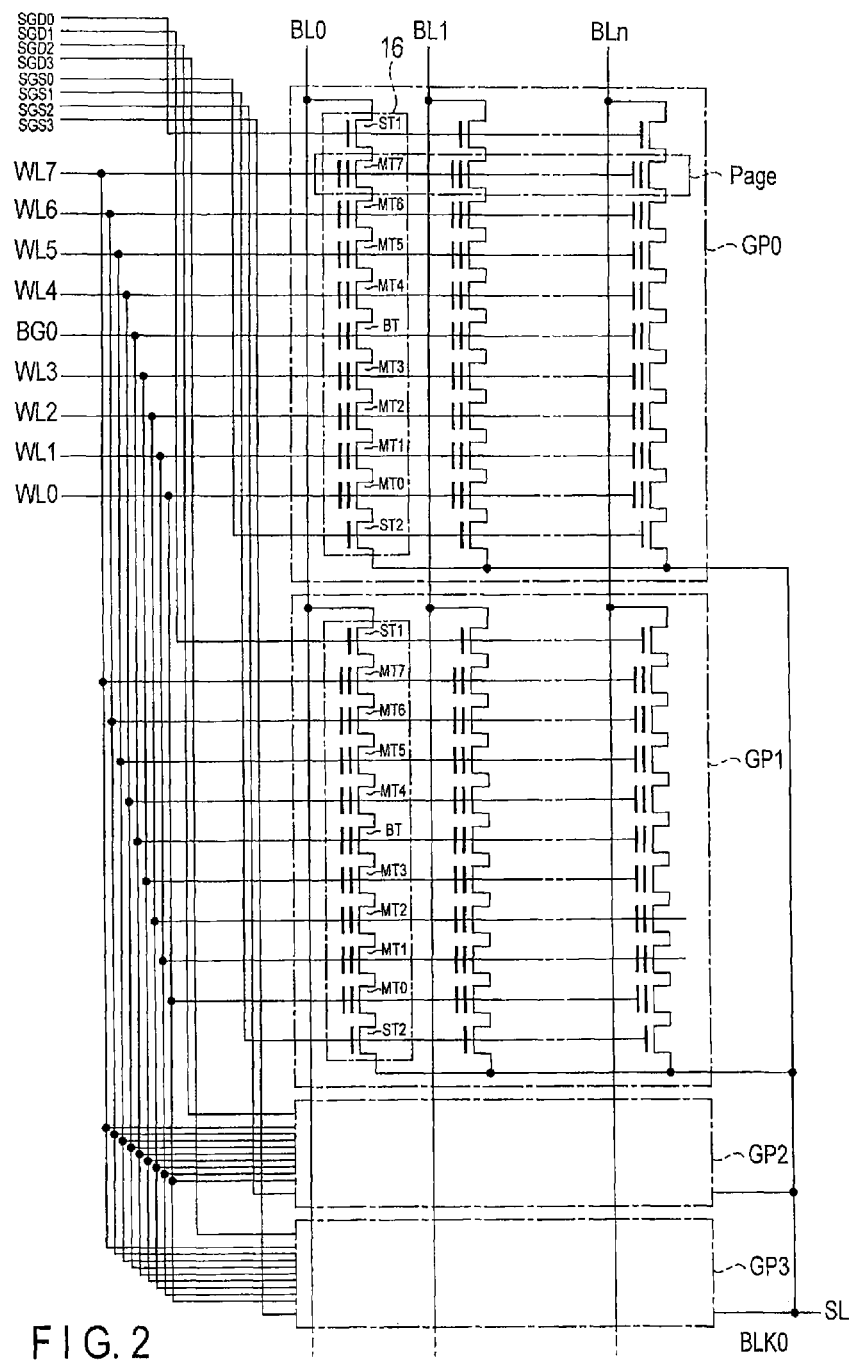

Details of the arrangement of the memory cell array 10 will be explained below. FIG. 2 is a circuit diagram of the block BLK0. The blocks BLK1 to BLK3 also have the same arrangement.

As shown in FIG. 2, the block BLK0 includes the four memory groups GP. Each memory group GP includes n (n is a natural number) NAND strings 16.

Each NAND string 16 includes, e.g., eight memory cell transistors MT (MT0 to MT7), selection transistors ST1 and ST2, and a backgate transistor BT. The memory cell transistor MT includes a stacked gate including a control gate and charge accumulation layer, and holds data in a nonvolatile manner. Note that the number of memory cell transistors MT is not limited to eight and may also be, e.g., 16, 32, 64, or 128, i.e., the number is not limited. Similarly to the memory cell transistor MT, the backgate transistor BT includes a stacked gate including a control gate and charge accumulation layer. However, the backgate transistor BT does not hold data, and functions as a mere current path in data write and erase. The memory cell transistors MT and backgate transistor BT are arranged between the selection transistors ST1 and ST2 such that their current paths are connected in series. Note that the backgate transistor BT is formed between the memory cell transistors MT3 and MT4. The current path of the memory cell transistor MT7 at one end of this series connection is connected to one end of the current path of the selection transistor ST1. The current path of the memory cell transistor MT0 at the other end of the series connection is connected to one end of the current path of the selection transistor ST2.

The gates of the selection transistors ST1 of each of the memory groups GP0 to GP3 are connected together to an associated one of select gate lines SGD0 to SGD3, and the gates of the selection transistors ST2 of each of the memory groups GP0 to GP3 are connected together to an associated one of select gate lines SGS0 to SGS3. On the other hand, the control gates of the memory cell transistors MT0 to MT7 in the same block BLK0 are connected together to word lines WL0 to WL7, respectively, and the control gates of the backgate transistors BT are connected together to a backgate line BG (BG0 to BG3 in the blocks BLK0 to BLK3, respectively).

That is, the word lines WL0 to WL7 and backgate lines BG are connected together across the plurality of memory groups GP0 to GP3 in the same block BLK0, but the select gate lines SGD and SGS are independent for each of the memory groups GP0 to GP3 even in the same block BLK0.

Also, among the NAND strings 16 arranged in a matrix in the memory cell array 10, the other-ends of the current paths of the selection transistors ST1 of the NAND strings 16 in the same row are connected together to one of bit lines BL (BL0 to BLn, n is a natural number). That is, the bit line BL connects the NAND strings 16 together across the plurality of blocks BLK. Furthermore, the other-ends of the current paths of the selection transistors ST2 are connected together to a source line SL. The source line SL connects the NAND strings 16 together across, e.g., a plurality of blocks.

As described previously, data of the memory cell transistors MT in the same block BLK is erased at once. On the other hand, data read and write are performed for a plurality of memory cell transistors MT connected together to a given word line WL in a given memory group GP of a given block BLK. This unit is called a "page".

Figure 4:
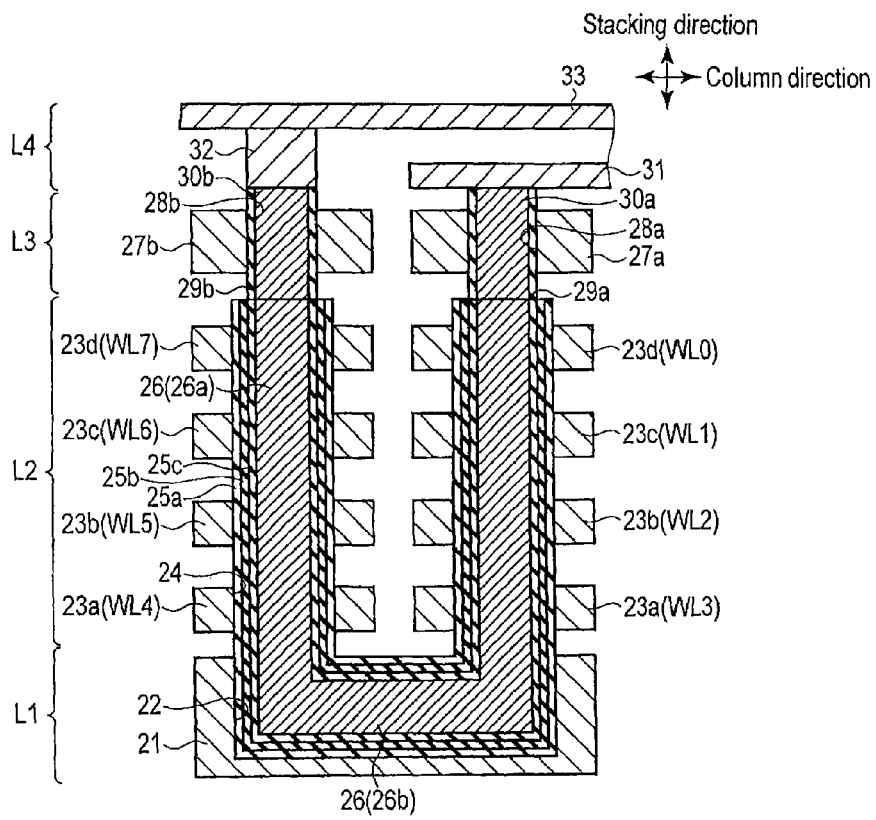

Next, the three-dimensionally stacked structure of the memory cell array 10 will be explained below with reference to FIGS. 3 and 4. FIGS. 3 and 4 are a perspective view and sectional view, respectively, of the memory cell array 10.

As shown in FIGS. 3 and 4, the memory cell array 10 is formed above a semiconductor substrate 20. The memory cell array 10 includes a backgate transistor layer L1, memory cell transistor layer L2, selection transistor layer L3, and interconnection layer L4 sequentially formed above the semiconductor substrate 20.

The backgate transistor layer L1 functions as the backgate transistors BT. The memory cell transistor layer L2 functions as the memory cell transistors MT0 to MT7 (NAND strings 16). The selection transistor layer L3 functions as the selection transistors ST1 and ST2. The interconnection layer L4 functions as the source line SL and bit lines BL.

The backgate transistor layer L1 includes a backgate conductive layer 21. The backgate conductive layer 21 is formed to two-dimensionally extend in the row and column directions parallel to the semiconductor substrate 20. The backgate conductive layer 21 is separated for each block BLK. The backgate conductive layer 21 is made of, e.g., polysilicon. The backgate conductive layer 21 functions as the backgate lines BG.

As shown in FIG. 4, the backgate conductive layer 21 has a backgate hole 22. The backgate hole 22 is made to scoop out the backgate conductive layer 21. The backgate hole 22 is made into an almost rectangular shape having a longitudinal direction in the column direction when viewed from the upper surface.

The memory cell transistor layer L2 is formed on the backgate conductive layer L1. The memory cell transistor layer L2 includes word line conductive layers 23a to 23d. The word line conductive layers 23a to 23d are stacked with interlayer dielectric layers (not shown) being sandwiched between them. The word line conductive layers 23a to 23d are formed into strips extending in the row direction at a predetermined pitch in the column direction. The word line conductive layers 23a to 23d are made of, e.g., polysilicon. The word line conductive layer 23a functions as the control gates (word lines WL3 and WL4) of the memory cell transistors MT3 and MT4, the word line conductive layer 23b functions as the control gates (word lines WL2 and WL5) of the memory cell transistors MT2 and MT5, the word line conductive layer 23c functions as the control gates (word lines WL1 and WL6) of the memory cell transistors MT1 and MT6, and the word line conductive layer 23d functions as the control gates (word lines WL0 and WL7) of the memory cell transistors MT0 and MT7.

As shown in FIG. 4, the memory cell transistor layer L2 has memory holes 24. The memory holes 24 are made to extend through the word line conductive layers 23a to 23d. The memory holes 24 are made to align with the end portion of the backgate hole 22 in the column direction.

As shown in FIG. 4, the backgate transistor layer L1 and memory cell transistor layer L2 further include a block insulating layer 25a, charge accumulation layer 25b, tunnel insulating layer 25c, and semiconductor layer 26. The semiconductor layer 26 functions as the body (the back gate of each transistor) of the NAND string 16.

As shown in FIG. 4, the block insulating layer 25a is formed with a predetermined thickness on sidewalls facing the backgate hole 22 and memory holes 24. The charge accumulation layer 25b is formed with a predetermined thickness on the side surfaces of the block insulating layer 25a. The tunnel insulating layer 25c is formed with a predetermined thickness on the side surfaces of the charge accumulation layer 25b. The semiconductor layer 26 is formed in contact with the side surfaces of the tunnel insulating layer 25c. The semiconductor layer 26 is formed to fill the backgate hole 22 and memory holes 24.

The semiconductor layer 26 is formed into a U-shape when viewed in the row direction. That is, the semiconductor layer 26 includes a pair of pillar portions 26a extending in a direction perpendicular to the surface of the semiconductor substrate 20, and a connecting portion 26b connecting the lower ends of the pair of pillar portions 26a.

The block insulating layer 25a and tunnel insulating layer 25c are made of, e.g., silicon oxide ($SiO_2$). The charge accumulation layer 25b is made of, e.g., silicon nitride (SiN). The semiconductor layer 26 is made of polysilicon. The block insulating layer 25a, charge accumulation layer 25b, tunnel insulating layer 25c, and semiconductor layer 26 form MONOS transistors that function as the memory cell transistors MT.

In the arrangement of the backgate transistor layer L1, the tunnel insulating layer 25c is formed to surround the connecting portions 26b. The backgate conductive layer 21 is formed to surround the connecting portions 26b.

Also, in the arrangement of the memory cell transistor layer L2, the tunnel insulating layer 25c is formed to surround the pillar portions 26a. The charge accumulation layer 25b is formed to surround the tunnel insulating layer 25c. The block insulating layer 25a is formed to surround the charge accumulation layer 25b. The word line conductive layers 23a to 23d are formed to surround the block insulating layers 25a to 25c and pillar portions 26a.

As shown in FIGS. 3 and 4, the selection transistor layer L3 includes conductive layers 27a and 27b. The conductive layers 27a and 27b are formed into strips extending in the row direction so as to have a predetermined pitch in the column direction. A pair of conductive layers 27a and a pair of conductive layers 27b are alternately arranged in the column direction. The conductive layer 27a is formed in an upper layer of one pillar portion 26a, and the conductive layer 27b is formed in an upper layer of the other pillar portion 26a.

The conductive layers 27a and 27b are made of polysilicon. The conductive layer 27a functions as the gate (select gate line SGS) of the selection transistor ST2. The conductive layer 27b functions as the gate (select gate line SGD) of the selection transistor ST1.

As shown in FIG. 4, the selection transistor layer L3 has holes 28a and 28b. The holes 28a and 28b respectively extend through the conductive layers 27a and 27b. Also, the holes 28a and 28b align with the memory holes 24.

As shown in FIG. 4, the selection transistor layer L3 includes gate insulating layers 29a and 29b, and semiconductor layers 30a and 30b. The gate insulating layers 29a and 29b are respectively formed on sidewalls facing the holes 28a and 28b. The semiconductor layers 30a and 30b are formed into pillars extending in the direction perpendicular to the surface of the semiconductor substrate 20, so as to come in contact with the gate insulating layers 29a and 29b, respectively.

The gate insulating layers 29a and 29b are made of, e.g., silicon oxide ($SiO_2$). The semiconductor layers 30a and 30b are made of, e.g., polysilicon.

In the arrangement of the selection transistor layer L3, the gate insulating layer 29a is formed to surround the pillar semiconductor layer 30a. The conductive layer 27a is formed to surround the gate insulating layer 29a and semiconductor layer 30a. The gate insulating layer 29b is formed to surround the pillar semiconductor layer 30b. The conductive layer 27b is formed to surround the gate insulating layer 29b and semiconductor layer 30b.

As shown in FIGS. 3 and 4, the interconnection layer L4 is formed on the selection transistor layer L3. The interconnection layer L4 includes a source line layer 31, plug layer 32, and bit line layer 33. The source line layer 31 is formed into a plate extending in the row direction. The source line layer 31 is formed in contact with the upper surfaces of the pair of semiconductor layers 27a adjacent to each other in the column direction. The plug layer 32 is formed in contact with the upper surface of the semiconductor layer 27b, so as to extend in the direction perpendicular to the surface of the semiconductor substrate 20. The bit line layer 33 is formed into strips extending in the column direction at a predetermined pitch in the row direction. The bit line layer 33 is formed in contact with the upper surface of the plug layer 32. The source line layer 31, plug layer 32, and bit line layer 33 are made of a metal such as tungsten (W). The source line layer 31 functions as the source line SL explained with reference to FIGS. 1 and 2, and the bit line layer 33 functions as the bit lines BL.

Figure 5:
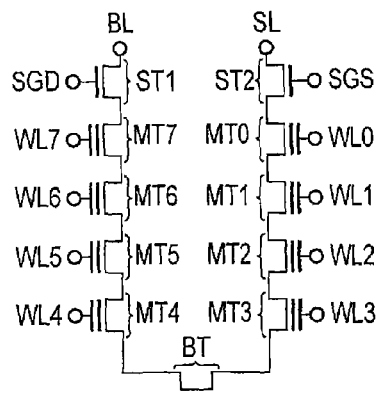
FIG. 5 is a circuit diagram of a NAND string according to the first embodiment.

FIG. 5 shows an equivalent circuit of the NAND string 16 shown in FIGS. 3 and 4. As shown in FIG. 5, the NAND string 16 includes the selection transistors ST1 and ST2, memory cell transistors MT0 to MT7, and backgate transistor BT. As described above, the memory cell transistors MT are connected in series between the selection transistors ST1 and ST2. The backgate transistor BT is connected in series between the memory cell transistors MT3 and MT4. In data write and read, the backgate transistor BT is kept ON.

The control gates of the memory cell transistors MT are connected to the word lines WL, and the control gate of the backgate transistor BT is connected to the backgate line BG. A set of the plurality of NAND strings 16 arranged along the row direction in FIG. 3 is equivalent to the memory group GP explained with reference to FIG. 2.

1.3 Row Decoders 11

Figure 6:
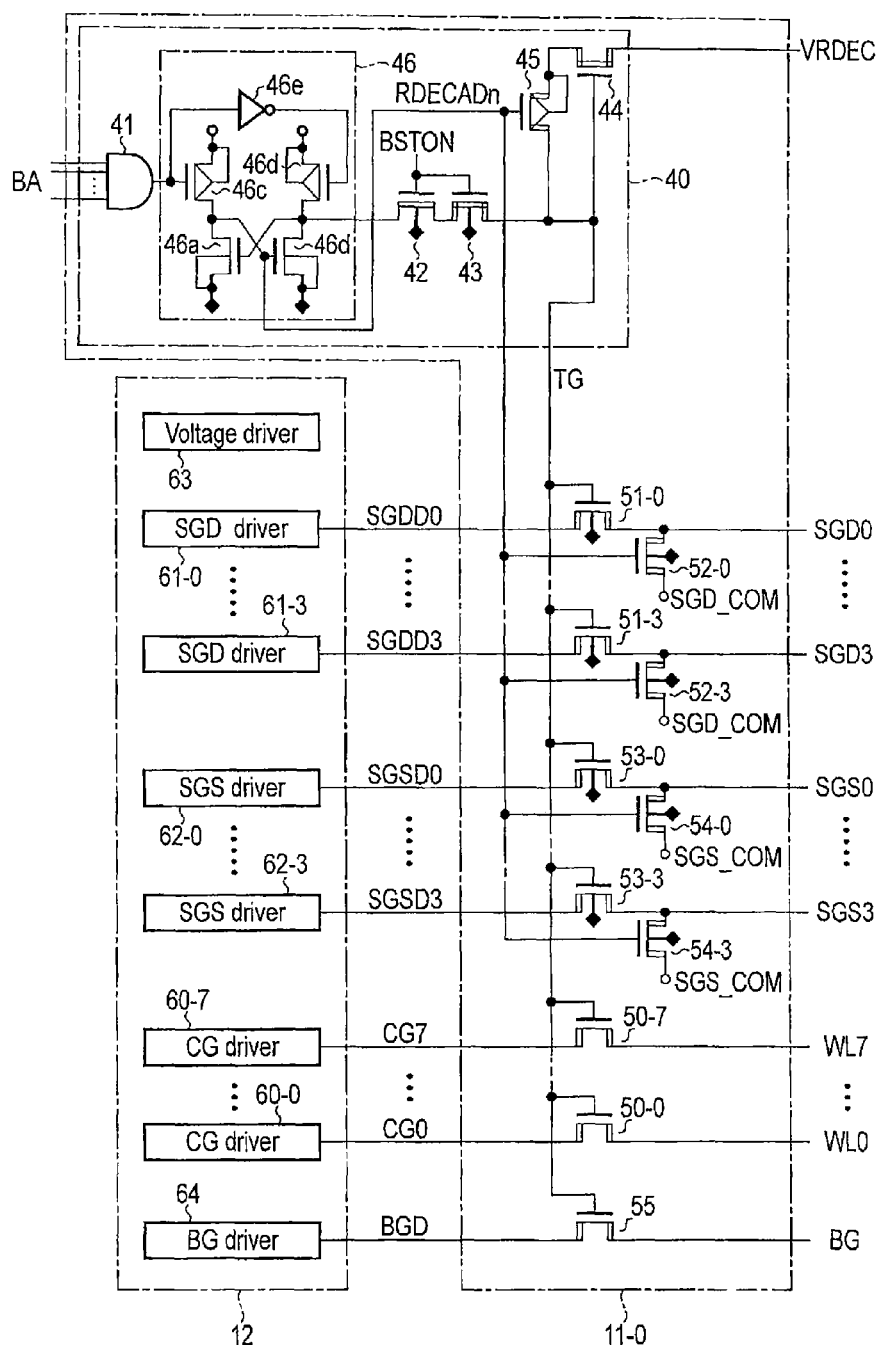
FIG. 6 is a block diagram of a row decoder and driver circuit according to the first embodiment.

The arrangement of the row decoders 11 will be explained below. The row decoders 11-0 to 11-3 are respectively associated with the blocks BLK0 to BLK3, in order to select or unselect the blocks BLK0 to BLK3. FIG. 6 shows the arrangement of the row decoder 11-0 and driver circuit 12. Note that the row decoders 11-1 to 11-3 also have the same arrangement as that of the row decoder 11-0.

As shown in FIG. 6, the row decoder 11 includes a block decoder 40, and high-withstand-voltage, n-channel enhancement type (E type: the threshold value is positive) MOS transistors 50 to 54 (50-0 to 50-7, 51-0 to 51-3, 52-0 to 52-3, 53-0 to 53-3, and 54-0 to 54-3) and 55. All the transistors 50 to 54 are high-breakdown-voltage transistors, and equal in channel region impurity concentration and threshold voltage.

1.3.1 Block Decoder 40

As shown in FIG. 6, the block decoder 40 includes an AND gate 41, a low-withstand-voltage, n-channel depletion type MOS transistor 42, high-withstand-voltage, n-channel depletion type (D type: the threshold voltage is negative) MOS transistors 43 and 44, a high-breakdown-voltage, p-channel E type MOS transistor 45, and a level shifter 46.

The AND gate 41 performs an AND operation the bits of an externally supplied block address BA. If the block address BA indicates the block BLK0 associated with the row decoder 11-0, the AND gate 41 outputs "H" level.

The level shifter 46 shifts the level of the output from the AND gate 41, and outputs the level-shifted signal. The level shifter 46 outputs, as a signal RDECADn, a signal obtained by inverting the output from the AND gate 41 and shifting the level of the inverted output. Also, the level shifter 46 supplies, to the transistor 42, a signal obtained by shifting the level of the output from the AND gate 41 without inverting the output. That is, the level shifter 46 includes low-withstand-voltage, n-channel E type MOS transistors 46a and 46b, low-withstand-voltage, p-channel E type MOS transistors 46c and 46d, and an inverter 46e.

The inverter 46e inverts the output from the AND gate 41. The transistor 46c has a gate connected to the output node of the AND gate 41, and a source and back gate to which a power supply voltage Vdd is applied. The transistor 46d has a gate connected to the output node of the inverter 46e, and a source and back gate to which the power supply voltage Vdd is applied. The transistor 46a has a drain connected to the drain of the transistor 46c, a source and back gate to which a negative voltage VBB is applied, and a gate connected to the drain of the transistor 46d. The transistor 46b has a drain connected to the drain of the transistor 46d, a source and back gate to which the negative voltage VBB is applied, and a gate connected to the drain of the transistor 46c. The potential of the drains of the transistors 46a and 46c and the gate of the transistor 46b is the signal RDECADn.

The transistor 42 has a current path having one end connected to the drains of the transistors 46d and 46b and the gate of the transistor 46a, and has a gate to which a signal BSTON is supplied. The transistor 43 has a current path having one end connected to the other end of the current path of the transistor 42, and the other end connected to a signal line TG, and has a gate to which the signal BSTON is supplied. The signal BSTON is a signal to be asserted (to "H" level) when receiving address information of the block decoder 40, and supplied by, e.g., the control circuit 15.

The transistor 45 has a current path having one end connected to the signal line TG, and the other end connected to the back gate, and has a gate to which the signal RDECADn is supplied. The transistor 44 has a current path having one end to which a voltage VRDEC is supplied, and the other end connected to the other end of the current path of the transistor 45, and has a gate connected to the signal line TG.

In data write, read, and erase, if the block address BA matches the block BLK0, the transistors 44 and 45 are turned on to apply the voltage VRDEC (in this embodiment, "H" level) to the signal line TG. If the block address BA does not match the block BLK0, the MOS transistors 44 and 45 are turned off, and the signal line TG is set at, e.g., 0 V ("L" level).

1.3.2 Transistors 50

The transistors 50 will be explained below. The transistors 50 transfer voltages to the word lines WL of a selected block BLK. Each of the transistors 50-0 to 50-7 has a current path having one end connected to an associated one of the word lines WL0 to WL7 of the block BLK0, and the other end connected to an associated one of signal lines CG0 to CG7, and has a gate connected to the signal line TG.

Accordingly, in the row decoder 11-0 associated with the selected block BLK0, for example, the transistors 50-0 to 50-7 are turned on to connect the word lines WL0 to WL7 to the signal lines CG0 to CG7. On the other hand, in the row decoders 11-1 to 11-3 associated with the unselected blocks BLK1 to BLK3, the transistors 50-0 to 50-7 are turned off to disconnect the word lines WL0 to WL7 from the signal lines CG0 to CG7.

1.3.3 Transistors 51 and 52

The transistors 51 and 52 will be explained below.

The transistors 51 and 52 transfer voltages to the select gate lines SGD. Each of the transistors 51-0 to 51-3 has a current path having one end connected to an associated one of the select gate lines SGD0 to SGD3 of the block BLK0, and the other end connected to an associated one of signal lines SGDD0 to SGDD3, and has a gate connected to the signal line TG, and a back gate to which the negative voltage VBB is applied. Each of the transistors 52-0 to 52-3 has a current path having one end connected to an associated one of the select gate lines SGD0 to SGD3 of the block BLK0, and the other end connected to a node SGD_COM, and has a gate to which the signal RDECADn is supplied. The node SGD_COM is at a voltage that turns off the selection transistor ST1, e.g., at 0 V.

Accordingly, in the row decoder 11-0 associated with the selected block BLK0, for example, the transistors 51-0 to 51-3 are turned on, and the transistors 52-0 to 52-3 are turned off. Therefore, the select gate lines SGD0 to SGD3 of the selected block BLK0 are connected to the signal lines SGDD0 to SGDD3.

On the other hand, in the row decoders 11-1 to 11-3 associated with the unselected blocks BLK1 to BLK3, the transistors 51-0 to 51-3 are turned off, and the transistors 52-0 to 52-3 are turned on. Therefore, the select gate lines SGD0 to SGD3 of the unselected blocks BLK1 to BLK3 are connected to the node SGD_COM.

1.3.4 Transistors 53 and 54

The transistors 53 and 54 transfer voltages to the select gate lines SGS. The connection and operation are equivalent to those of the transistors 51 and 52 with the select gate lines SGD replaces by the select gate lines SGS.

That is, in the row decoder 11-0 associated with the selected block BLK0, the transistors 53-0 to 53-3 are turned on, and the transistors 54-0 to 54-3 are turned off. On the other hand, in the row decoders 11-1 to 11-3 associated with the unselected blocks BLK1 to BLK3, the transistors 53-0 to 53-3 are turned off, and the transistors 54-0 to 54-3 are turned on.

1.3.5 Transistor 55

The transistor 55 will be explained below. The transistor 55 transfers voltages to the backgate line BG. The transistor 55 has a current path having one end connected to the backgate line B00 of the block BLK0, and the other end connected to a signal line BGD, and has a gate connected to the signal line TG.

Accordingly, the transistor 55 is turned on in the row decoder 11-0 associated with the selected block BLK0, and turned off in the row decoders 11-1 to 11-3 associated with the unselected blocks BLK1 to BLK3.

1.3.6 Well Isolation of Row Decoder 11

FIG. 7 is a sectional view of a partial region of the row decoder 11. As shown in FIG. 7, the transistors 42, 43, 46*a*, 46*b*, and 51 to 54 having the back gates to which the negative voltage VBB is applied are formed on p-well regions 36. Each p-well region 36 is formed in the surface of an n-well region 35 formed in the surface of the semiconductor substrate 20.

Thus, the transistors 42, 43, 46*a*, 46*b*, and 51 to 54 are electrically isolated from the transistors having the back gates to which a voltage of 0 V or more is applied.

Note that in FIG. 7, the pair of the transistors 42 and 43, the pair of the transistors 46*a* and 46*b*, the pair of the transistors 51 and 52, and the pair of the transistors 53 and 54 are formed on different well regions 36. However, the four well regions 36 (and four well regions 35) may also be collected into a single region.

Note also that in FIG. 7, the transistor 50 is formed on the semiconductor substrate 20. The transistor 50 may thus be formed on the semiconductor substrate 20 because the transistor 50 does not transfer any negative voltage, but the transistor 50 may also be formed on the well region 36.

1.4 Driver Circuit 12

The arrangement of the driver circuit 12 will now be explained. The driver circuit 12 transfers voltages necessary for data write, read, and erase to the signal lines CG0 to CG7, SGDD0 to SGDD3, SGSD0 to SGSD3, and BGD.

As shown in FIG. 6, the driver circuit 12 includes CG drivers 60 (60-0 to 60-7), SGD drivers 61 (61-0 to 61-3), SGS drivers 62 (62-0 to 62-3), a BG driver 64, and a voltage driver 63.

1.4.1 Voltage Driver 63

First, the voltage driver 63 will be explained. The voltage driver 63 generates voltages to be used by the block decoder 40 and CG drivers 60.

Figure 8:
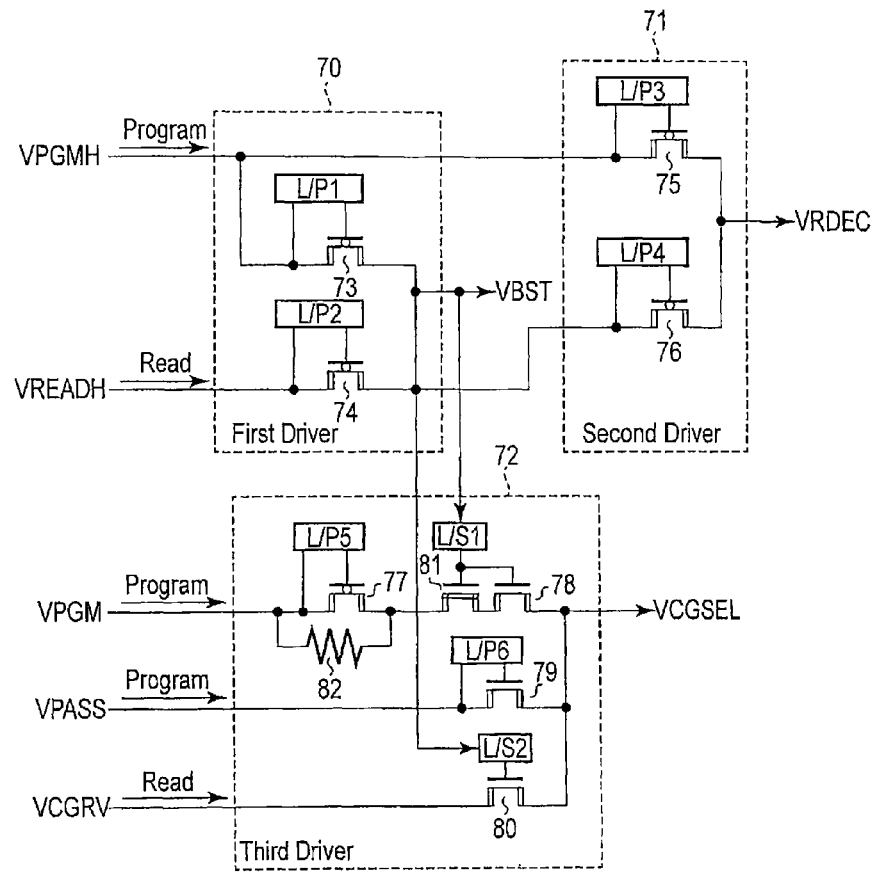
FIGS. 8 and 9 are circuit diagrams of a voltage driver and voltage generator, respectively, according to the first embodiment.

FIG. 8 is a circuit diagram of the voltage driver 63. As shown in FIG. 7, the voltage driver 63 includes first, second, and third drivers 70, 71, and 72 for generating voltages VBST, VRDEC, and VCGSEL, respectively.

The first driver 70 includes high-withstand-voltage, n-channel MOS transistors 73 and 74, and local pump circuits L/P1 and L/P2.

The current path of the transistor 73 has one end to which a voltage VPGMH is applied in programming, and which is connected to the local pump circuit L/P1. The voltage VPGMH is applied by the voltage generator 14, and higher than a voltage VPGM. VPGM is a high voltage to be applied to a selected word line in programming. Also, the local pump circuit L/P1 applies a voltage to the gate of the transistor 73 in programming.

The current path of the transistor 74 has one end to which a voltage VREADH is applied in data read, and which is connected to the local pump circuit L/P2. The voltage VREADH is applied by the voltage generator 14, and higher than a voltage VREAD. VREAD is a voltage that is applied to an unselected word line in data read, and turns on the memory cell transistor MT regardless of held data. Also, the local pump circuit L/P2 applies a voltage to the gate of the transistor 74 in data read. The other-ends of the current paths of the transistors 73 and 74 are connected together, and the voltage of this connection node is output as the voltage VBST.

In the first decoder 70 in the above-mentioned arrangement, the transistor 73 is turned on to output voltage VBST=VPGMH in programming. In data read, the transistor 74 is turned on to output voltage VBST=VREADH.

The second driver 71 will be explained below. The second driver 71 includes high-withstand-voltage, re-channel MOS transistors 75 and 76, and local pump circuits L/P3 and L/P4.

The current path of the transistor 75 has one end to which the voltage VPGMH is applied in programming, and which is connected to the local pump circuit L/P3. The local pump circuit L/P3 applies a voltage to the gate of the transistor 75 in programming.

The current path of the transistor 76 has one end to which the voltage VREADH is applied in data read, and which is connected to the local pump circuit L/P4. The local pump circuit L/P4 applies a voltage to the gate of the transistor 76 in data read. The other-ends of the current paths of the transistors 75 and 76 are connected together, and the voltage of this connection node is output as the voltage VRDEC.

In the second decoder 71 in the aforementioned arrangement, the transistor 75 is turned on to output voltage VRDEC=VPGMH in programming. In data read, the transistor 76 is turned on to output voltage VRDEC=VREADH.

The third driver 72 will be explained below. The third driver 72 includes high-withstand-voltage, re-channel MOS transistors 77 to 80, a high-withstand-voltage, n-channel depletion type MOS transistor 81, a resistance element 82, local pump circuits L/P5 and L/P6, and level shifters L/S1 and L/S2.

The voltage VPGM is applied to one end of the current path of the transistor 77, and this end is connected to the local pump circuit L/P5. The local pump circuit L/P5 applies a voltage to the gate of the transistor 77.

The current path of the transistor 81 has one end connected to the other end of the current path of the transistor 77, and the other end connected to one end of the current path of the transistor 78. An output from the level shifter L/S1 is applied to the gates of the transistors 78 and 81. In programming, the level shifter L/S1 receives the voltage VEST from the first driver 70, shifts the level of the voltage VBST, and outputs the level-shifted voltage.

The transistor 79 has a current path having one end to which a voltage VPASS is applied, and which is connected to the local pump circuit L/P6, and has a gate to which an output from the local pump circuit L/P6 is applied. The voltage VPASS is a voltage that is applied to an unselected word line of an unselected block in programming, and turns on the memory cell transistor MT regardless of held data.

The transistor 80 has a current path having one end to which a voltage VCGR is applied, and has a gate to which an output from the level shifter L/S2 is applied. In data read, the level shifter L/S2 receives the voltage VREADH from the voltage generator 14, shifts the level of the voltage VREADH, and outputs the level-shifted voltage.

The resistance element 82 has one terminal connected to one end of the current path of the transistor 77, and the other terminal connected to the other end of the current path of the transistor 77.

The other-ends of the current paths of the transistors 78 to 80 are connected together. This connection node is the output node of the third driver 72, and outputs the voltage VCGSEL.

Figure 9:
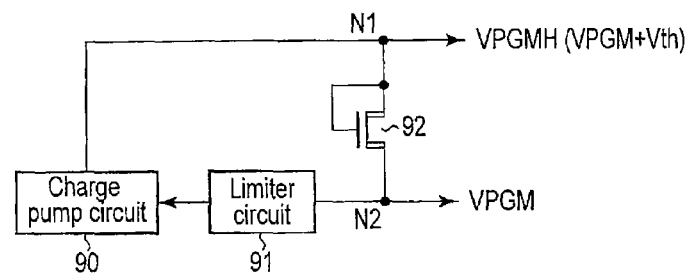

Note that a charge pump circuit in the voltage generator 14 generates the voltages VPGMH, VREADH, VPASS, and VCGR described above and a voltage VPASSA to be described later. Note also that the voltages VPGM and VREAD are generated by, e.g., stepping down the voltages VPGMH and VREADH. FIG. 9 shows an arrangement example for generating the voltages VPGMH and VPGM in the voltage generator 14.

As shown in FIG. 9, the voltage generator 14 includes a charge pump circuit 90, limiter circuit 91, and high-withstand-voltage, n-channel MOS transistor 92. The charge pump circuit 90 generates the voltage VPGMH, and outputs the voltage VPGMH to a node N1. The transistor 92 is diode-connected between the node N1 and a node N2. The transistor 92 has the same size and same threshold voltage as those of the transistor 50.

The potential of the node N2 is output as VPGM. Accordingly, VPGMH=VPGM+Vth where Vth is the threshold voltage of the transistor 92. The limiter circuit 91 monitors the voltage VPGM, and controls the charge pump circuit 90 to give VPGM a desired value. This similarly applies to VREADH and VREAD.

1.4.2 CG Drivers 60

The CG drivers 60 will be explained below. The CG drivers 60-0 to 60-7 each transfer necessary voltages to an associated one of the signal lines CG0 to CG7 (word lines WL0 to WL7). FIG. 10 is a circuit diagram of the CG driver 60-0. The CG drivers 60-1 to 60-7 also have the same arrangement.

As shown in FIG. 10, the CG driver 60 includes high-withstand-voltage, n-channel E-type MOS transistors 100, 101, 103, and 104, local pump circuits L/P6 and L/P8, and level shifters L/S3 and L/S4.

The transistor 100 has a current path having one end to which the voltage VCGSEL is applied, and the other end connected to an associated signal line CG (CGi in a CG driver 60-i where i is one of 0 to 7), and has a gate to which an output from the level shifter L/S3 is applied. In programming or data read, the level shifter L/S3 receives the voltage VBST from the voltage driver 63, shifts the level of the voltage VBST, and outputs the level-shifted voltage. The transistor 101 has a current path having one end to which the voltage VPASS is applied and which is connected to the local pump circuit L/P6, and the other end connected to the associated signal line CG, and has a gate to which an output from the local pump circuit L/P6 is applied. The transistor 103 has a current path having one end to which the voltage VREAD is applied and which is connected to the local pump circuit L/P8, and the other end connected to the associated signal line CG, and has a gate to which an output from the local pump L/P8 is applied. The transistor 104 has a current path having one end to which a voltage VISO is applied, and the other end connected to the associated signal line CG, and has a gate to which an output from the level shifter L/S4 is applied. In programming, the level shifter L/S4 receives the voltage VREADH, shifts the level of the voltage VREADH, and outputs the level-shifted voltage. The voltage VISO is a voltage for turning off the memory cell transistor MT regardless of held data.

In the CG driver 60 associated with a selected word line WL in the aforementioned arrangement, the control circuit 15 or the like turns on the transistor 100 in programming, thereby transferring the voltage VPGM (VCGSEL=VPGM) to the associated signal line CG in programming. In data read, the transistor 100 is turned on to transfer the voltage VCGR (VCGSEL=VCGRV) to the associated signal line CG. These voltages are transferred to the selected word line WL via the current path of the transistor 50 in the row decoder 11.

In the CG driver 60 associated with an unselected word line, the control circuit 15 or the like turns on the transistor 100 and/or 101 or the transistor 104 in programming. The CG driver 60 in which the transistor 100 and/or 101 is turned on transfers the voltage VPASS to the associated signal line CG. The CG driver 60 in which the transistor 104 is turned on transfers the voltage VISO to the associated signal line CG. In data read, the transistor 103 is turned to transfer the voltage VREAD to the associated signal line CG. These voltages are transferred to the unselected word line WL via the current path of the transistor 50 in the row decoder 11.

Note that the blocks BLK may also share CG0 to CG7. That is, the four word lines WL0 belonging to the four blocks BLK0 to BLK3 may also be driven by the same CG driver 60-0 via the transistors 50-0 of the associated row decoders 11-0 to 11-3. This similarly applies to the signal lines CG1 to CG7.

1.4.3 SGD Drivers 61

The SGD drivers 61 will be explained below. The SGD drivers 61-0 to 61-3 transfer necessary voltages to the signal lines SGDD0 to SGDD3 (select gate lines SGD0 to SGD3). FIG. 11 is a circuit diagram of the SGD driver 61-0. The SGD drivers 61-1 to 61-3 also have the same arrangement.

As shown in FIG. 11, the SGD driver 61 includes high-withstand-voltage, n-channel E-type MOS transistors 110 and 111, and a level shifter L/S5. The transistor 110 has a current path having one end to which a voltage VSGD is applied, and the other end connected to an associated signal line SGDD (SGDDj in an SGD driver 61-j where j is one of 0 to 3), and has a gate to which an output from the level shifter L/S5 is applied. In programming or data read, the level shifter L/S5 receives the voltage VREADH, shifts the level of the voltage VREADH, and outputs the level-shifted voltage. The transistor 111 has a source to which the negative voltage VBB is applied, a drain connected to the associated signal line SGDD, and a gate to which a signal USEL1 is supplied. The control circuit 15 sets the signal USEL1 at "L" level (e.g., VBB) when the SGD driver 61 is associated with a NAND string including a selected cell in data write and read, and at "H" level in other SGD drivers 61.

When performing data read and write in the above-described arrangement, in the SGD driver 61 associated with the select gate line SGD connected to the NAND string 16 including a selected word line, the transistor 110 is turned on, and the transistor 111 is turned off. Accordingly, the voltage VSGD is transferred to the associated signal line SGDD. The voltage VSGD is a voltage for turning on the selection transistor ST1 in data read (in data write, this voltage turns on the transistor in accordance with write data). In other SGD drivers 61, the transistors 111 are turned on, and the transistors 110 are turned off, thereby transferring the negative voltage VBB to the signal lines SGDD.

The transistor 111 transfers a negative voltage. Like the transistors 51 to 54 and the like explained with reference to FIG. 7, therefore, the transistor 111 is formed on the p-well region 36 electrically isolated from the semiconductor substrate 20. Note that the transistor 110 may be formed on either the semiconductor substrate 20 or well region 36.

1.4.4 SGS Drivers 62

The SGS drivers 62 will be explained below. The SGS drivers 62-0 to 62-3 transfer necessary voltages to the signal lines SGSD0 to SGSD3 (select gate lines SGS0 to SGS3). FIG. 12 is a circuit diagram of the SGS driver 62-0. The SGS drivers 62-1 to 62-3 also have the same arrangement.

As shown in FIG. 12, the SGS driver 62 includes high-withstand-voltage, n-channel MOS transistors 120 and 121, and a level shifter L/S6. The transistor 120 has a current path having one end to which the voltage VSGS is applied, and the other end connected to an associated signal line SGSD (SGSDk in an SGS driver 62-k where k is one of 0 to 3), and has a gate to which an output from the level shifter L/S6 is applied. In data read, the level shifter L/S6 receives the voltage VREADH, shifts the level of the voltage VREADH, and outputs the level-shifted voltage. The transistor 121 has a source to which the negative voltage VBB is applied, a drain connected to the associated signal line SGSD, and a gate to which a signal USEL2 is supplied. In data write, the control circuit 15 or the like sets the signal USEL2 at "H" level in all the SGS drivers 62. In data read, the signal USEL2 is set at "L" level (e.g., VBB) when the SGD driver 61 is associated with a NAND string including a selected cell, and "H" level in other SGD drivers 61.

When performing data read in the above-described arrangement, in the SGS driver 62 associated with the select gate line SGS connected to the NAND string 16 including a selected word line, the transistor 120 is turned on, and the transistor 121 is turned off, thereby transferring a voltage VSGS to the associated signal line SGSD. The voltage VSGS is a voltage for turning on the selection transistor ST2. In other SGS drivers 62, the transistors 121 are turned on, and the transistors 120 are turned off, thereby transferring the negative voltage VBB to the signal lines SGSD.

In data write, the transistors 120 are turned off and the transistors 121 are turned on in all the SGS drivers 62, thereby transferring the negative voltage VBB to the signal lines SGSD.

The transistor 121 transfers a negative voltage. Like the transistor 111, therefore, the transistor 121 is formed on the p-well region 36. Note that the transistor 120 may be formed on either the semiconductor substrate 20 or well region 36.

1.4.5 BG Driver 64

The BG driver 64 will now be explained. The BG driver 64 is equivalent to, e.g., an arrangement obtained by omitting the VCGSEL transfer path from the CG driver 60 explained with reference to FIG. 10. That is, in data write, the transistor 101 or 103 transfers VPASS or VISO to the backgate line BG. In data read, the transistor 103 transfers VREAD to the backgate line BG.

2. Operation of Semiconductor Memory Device 1

The operation of the NAND flash memory having the above arrangement will now be explained.

2.1 Write Operation

Figure 13:
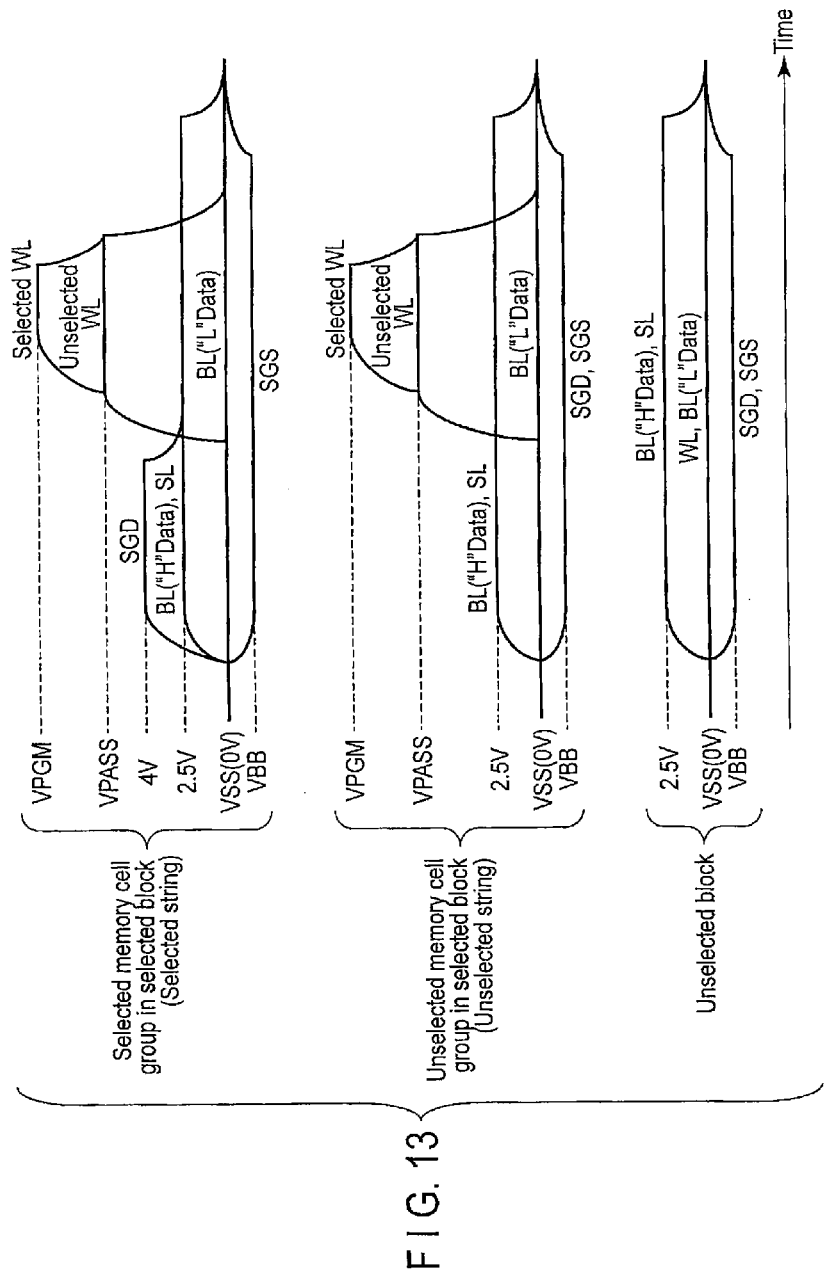
FIG. 13 is a timing chart of various signals according to the first embodiment.
Figure 14:
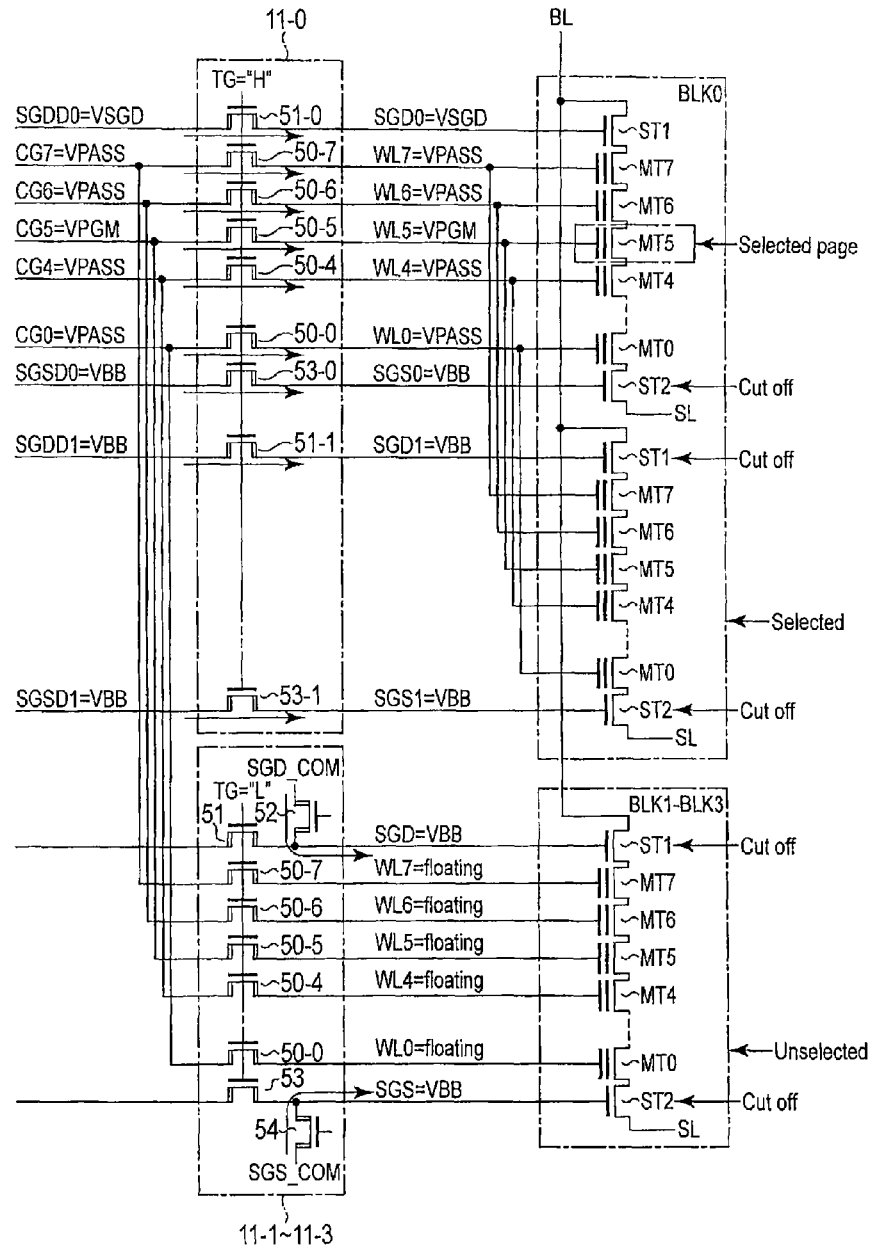
FIG. 14 is a circuit diagram of the row decoder and memory cell array according to the first embodiment.

First, the write operation will be explained below with reference to FIGS. 13 and 14. FIG. 13 is a timing chart showing the potentials of the interconnections in the write operation. FIG. 14 is a circuit diagram of the memory cell array 10 and row decoders 11 in programming (an operation of trapping electric charge in the charge accumulation layer). As an example, FIG. 14 shows a state in which the block BLK0 is selected, and the memory cell transistor MT5 in the memory group GP0 in the selected block BLK0 is selected. Note that FIG. 14 shows only the memory groups GP0 and GP1 of the block BLK0 for convenience, but the memory groups GP2 and GP3 are the same as GP1.

As shown in FIG. 13, the sense amplifier 13 first transfers write data to each bit line BL. Data "L" (e.g., VSS=0 V) is applied to the bit line BL in order to raise the threshold value by injecting electric charge in the charge accumulation layer, and data "H" (e.g., 2.5 V) is applied in other cases. Also, a source line driver (not shown) applies, e.g., 2.5 V to the source line SL.

In the row decoder 11, the block decoder 40 decodes the block address BA to set TG="H" level in a selected block, and the transistors 50, 51, and 53 of the row decoder 11 are turned on. That is, as shown in FIG. 14, in the row decoder 11-0 associated with the selected block BLK0, the transistors 50, 51, and 53 are turned on, and the transistors 52 and 54 are turned off. In the row decoders 11-1 to 11-3 associated with the unselected blocks BLK1 to BLK3, TG="L" level (e.g., VBB) is set, the transistors 50, 51, and 53 are turned off, and the transistors 52 and 54 are turned on.

In the unselected blocks BLK1 to BLK3, therefore, the transistors 52 and 54 transfer the negative voltage VBB to the select gate lines SGD and SGS, thereby cutting off both the selection transistors ST1 and ST2.

On the other hand, in the selected block BLK0, the voltage VSGD (e.g., 4 V) is transferred to the select gate line SGD0 associated with the memory group GP0 including a selected page, and the transistors 111 and 121 transfer the negative voltage VBB to the select gate lines SGD1 to SGD3 and SGS1 to SGS3 associated with the memory groups GP1 to GP3. Accordingly, the selection transistor ST1 is turned on and the selection transistor ST2 is turned off in the memory group GP0, and both the selection transistors ST1 and ST2 are turned off in the memory groups GP1 to GP3.

After that, the control circuit 15 or the like decreases the voltage VSGD from 4 V to about 2.5 V. This voltage turns on the selection transistor ST1 when data "L" is transferred to the bit line BL, and cuts off the transistor when data "H" is transferred.

Then, the control circuit 15 or the like activates the CG driver 60 to transfer a voltage to each signal line CG. That is, VPGM is transferred to the CG driver 60 associated with a selected word line, and VPASS (or VISO) is transferred to the CG driver 60 associated with an unselected word line. Referring to FIG. 14, the voltage VPGM is transferred to the signal line CG5, and the voltage VPASS is transferred to the signal lines CG0 to CG4, CG6, and CG7 (VISO may also be transferred to a given CG line). Since the transistors 50 are ON in the selected block BLK0, these voltages are transferred to the word lines WL0 to WL7. On the other hand, the transistors 50 are OFF in the unselected blocks BLK1 to BLK3, so none of these voltages are transferred to the word lines WL. That is, the word lines WL0 to WL7 in the unselected blocks BLK1 to BLK3 are electrically floated.

2.2 Read Operation

Figure 15:
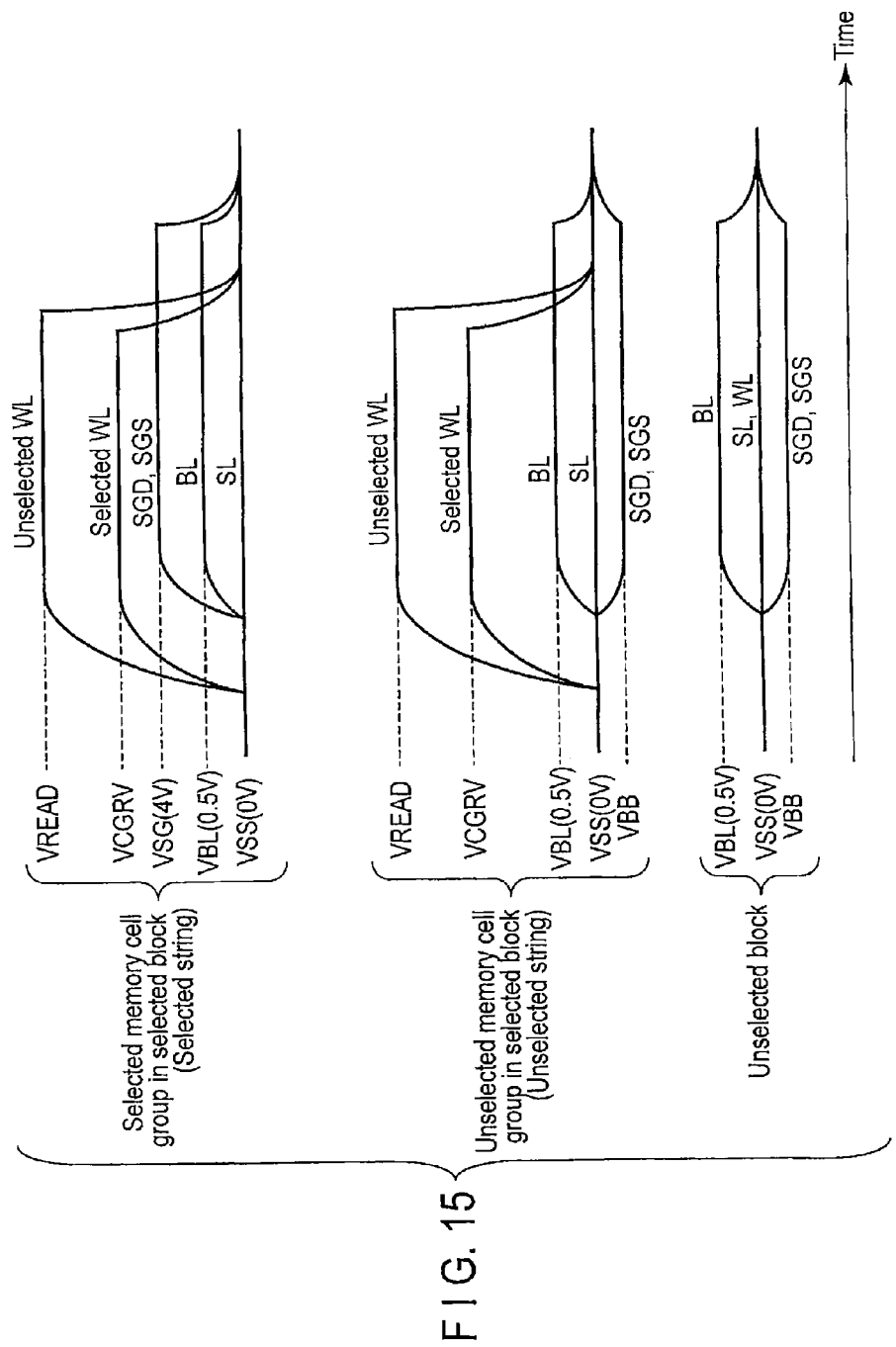
FIG. 15 is a timing chart of various voltages according to the first embodiment.

Next, the read operation will be explained with reference to FIG. 15. FIG. 15 is a timing chart showing the potentials of the interconnections in the read operation.

As shown in FIG. 15, the CG driver 60 first generates the voltages VCGRV and VREAD. In a selected block, therefore, the voltages VCGRV and VREAD are transferred to the word lines WL. In an unselected block, the word lines WL are electrically floated.

Then, voltages are transferred to the select gate lines SGD and SGS. In a selected memory group of the selected block BLK, the transistors 110 and 120 transfer the voltages VSGD and VSGS (e.g., 4 V) to the select gate lines SGD and SGS. This turns on the selection transistors ST1 and ST2. In an unselected memory group of the selected block BLK, the transistors 111 and 121 transfer the voltage VBB to the select gate lines SGD and SGS. This turns off the selection transistors ST1 and ST2. Furthermore, in an unselected block BLK, the transistors 52 and 54 transfer the voltage VBB to the select gate lines SGD and SGS. This turns off the selection transistors ST1 and ST2.

Also, the source line SL is set at VSS, and VBL (0.5 V), for example, is applied to the bit lines BL.

3. Effects of this Embodiment

The arrangement according to this embodiment can improve the operational reliability of a NAND flash memory. This effect will be explained below.

For a NAND string in which no data is to be written (no electric charge is to be injected) in a NAND flash memory, the channel potential is raised by coupling with a word line by cutting off the selection transistor ST1. This technique is known as the self-boost technique.

In the three-dimensionally stacked NAND flash memory (this embodiment) shown in FIGS. 3, 4, and 5, the threshold value of the select gates at the two ends of the NAND string 16 is difficult to control from the viewpoint of fabrication. This is so because the channel portions of the selection transistors ST1 and ST2 are made of intrinsic polysilicon. Therefore, the threshold value of the selection transistors ST1 and ST2 may be a negative value in some cases.

As a consequence, even when the ground potential VSS is supplied to unselected select gate lines SGD and SGS of a selected block or to the select gate lines SGD and SGS of an unselected block in, e.g., data write, it is sometimes impossible to cut off the selection transistors ST1 and ST2 and sufficiently raise the channel potential, so the data may be written in an unselected cell.

In this embodiment, however, the negative voltage can be applied to unselected select gate lines SGD and SGS of a selected block (and to the select gate lines SGD and SGS of an unselected block).

Also, the transistors (transistors 51 to 54, 111, and 121) for transferring the negative voltage are formed in the triple well (see FIG. 7), and the negative voltage is applied to this well (back gate). This makes it possible to transfer the negative voltage. Furthermore, in order to turn on the transistors 51 to 54, 111, and 121, the transistors 42, 43, 46a, and 46b for driving the gates of these transistors are also formed in the triple well, and the negative voltage is applied to the well.

Accordingly, even when the threshold value of the selection transistors ST1 and ST2 to be cut off is a negative value, it is possible to prevent the selection transistors ST1 and ST2 from being turned on, and improve the operation reliability.

Also, in the three-dimensionally stacked NAND flash memory, very many interconnections (word lines and select gate lines) are extracted to a narrow pitch of one NAND string. This extremely increases the area of the row decoders in order to independently control these interconnections for each NAND string (i.e., each memory group).

In this embodiment, therefore, a plurality of NAND strings (memory groups) share the word lines WL (see FIG. 2). As described earlier, the unit of this sharing is a block. The selectivity of each NAND string in a block is secured by independently controlling the select gate lines SGD and SGS for each NAND string. This makes it possible to decrease the size of the row decoders 11.

[Second Embodiment]

A semiconductor memory device according to the second embodiment will be explained below. In this embodiment, the channel compositions of the transistors 50 and 51 are made different in the above-mentioned first embodiment. Only the differences from the first embodiment will be explained below.

Figure 16:
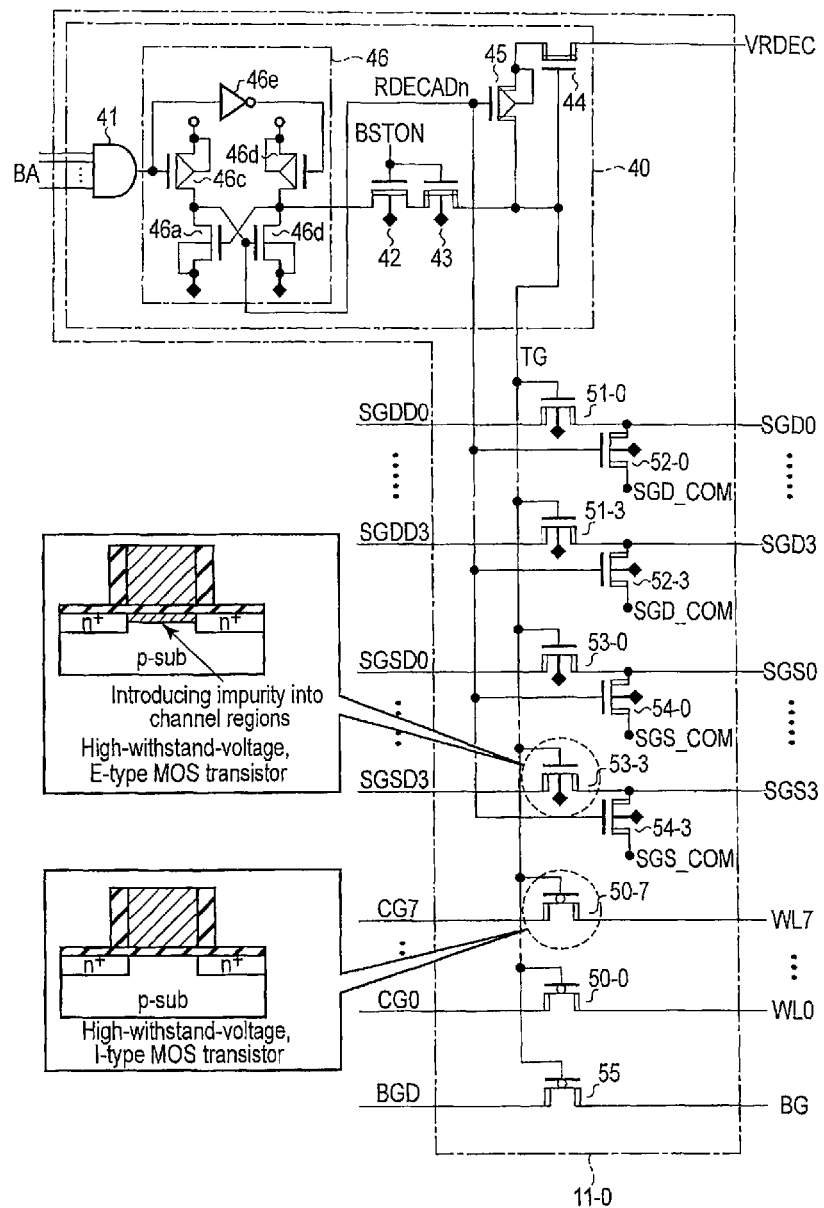
FIG. 16 is a circuit diagram of a row decoder and memory cell array according to the second embodiment.

1. Arrangement of Row Decoder 11 FIG. 16 is a circuit diagram of a row decoder 11 according to this embodiment. As shown in FIG. 16, the row decoder 11 according to this embodiment has an arrangement in which the impurity concentration (and/or the impurity type) in the channel regions of transistors 50 and 55 is made different from that of transistors 51 and 53, and intrinsic type (I-type) transistors having a threshold voltage of almost 0 V are used as the transistors 50 and 55, in FIG. 6 explained in the first embodiment.

Also, a transistor 92 of a voltage generator 14 explained in FIG. 9 is also the same I-type as the transistors 50 and 55, and they have the same threshold voltage.

2. Effects of this Embodiment

In the arrangement according to this embodiment, the transistor 50 for transferring a voltage to a word line WL is a high-withstand-voltage, I-type MOS transistor. Even in this case, the transistor 50 can be cut off by applying a negative voltage VBB to a signal line TG.

In this arrangement, the potential of the signal line TG can be decreased because the threshold value of the transistor 50 is smaller than that of the first embodiment. The potential of the signal line TG in a selected block is VRDEC, and this value is VPGMH (=VPGM+Vth) in data write as explained in the first embodiment. VPGMH is the highest voltage in a NAND flash memory 1. In this respect, this embodiment can decrease the value of VPGMH by decreasing the value of Vth. Consequently, it is possible to reduce the load of a charge pump circuit 90 for generating VPGMH, and reduce the current consumption of the NAND flash memory 1.

Especially in a three-dimensionally stacked NAND flash memory, the threshold voltage of a memory cell in an erased state sometimes has a positive value. That is, electric charge is trapped in a charge accumulation layer even in the erased state. In this case, the threshold voltages of memory cells in a written state also shift to high voltages as a whole. Accordingly, the power consumption of this NAND flash memory is higher than that of a memory in which the threshold value of a memory cell in the erased state is negative. From the viewpoint of the ability to reduce power consumption, therefore, this embodiment is desirably applied to a NAND flash memory like this.

[Modifications]

As described above, the semiconductor memory device 1 according to this embodiment includes the memory cell (MT in FIG. 2), selection transistor (ST1 in FIG. 2), memory string (NAND string 16 in FIG. 2), block (BLK in FIG. 1), word line (WL in FIG. 2), select gate line (SGD in FIG. 2), bit line (BL in FIG. 2), and transfer circuit (row decoder 11 in FIG. 14). The memory cell (MT in FIG. 2) is stacked above a semiconductor substrate, and includes a charge accumulation layer and control gate. In the memory string (NAND string 16 in FIG. 2), the current paths of the memory cells and the selection transistor are connected in series. The block (BLK in FIG. 1) includes a plurality of memory strings. The word line (WL in FIG. 2) is coupled to the control gate. The select gate line (SGD in FIG. 2) is coupled to a gate of the selection transistor. The bit line (BL in FIG. 2) is coupled to one of the memory cells through the current path of the selection transistor. In data write and read, the transfer circuit (row decoder 11 in FIG. 14) transfers a positive voltage (VSGD in FIG. 14) to a select gate line (SGD0 in FIG. 14) associated with a selected memory string in a selected block (BLK0 in FIG. 14), and a negative voltage (VBB in FIG. 14) to a select gate line (SGD1 in FIG. 14) associated with an unselected memory string in the selected block (BLK0 in FIG. 14), and to a select gate line (SGD in FIG. 14) associated with a memory string in an unselected block (BLK1-3 in FIG. 14).

As described above, since the row decoder (transfer circuit) 11 for applying a negative potential to the select gate line is used, the selection transistor in an unselected NAND string 16 of a selected block can be cut off even when the transistor has a negative threshold value. This can be achieved by forming the driving transistors 51 to 54 of the select gate lines in the triple wells, and changing the well potential to a negative potential during programming or read. In programming or read, normal read or write can be performed by setting the select gate lines of unselected strings of an unselected block and selected block at a negative potential, and connecting the select gate line of a selected string of the selected block to another node (the driver circuit 12).

Note that the embodiments are not limited to the forms explained above, and various modifications can be made. For example, the transistor 50 explained with reference to FIG. 16 may also be a depletion type (D-type) MOS transistor having a negative threshold value. By using an I-type or D-type transistor, the transistor 50 can be turned off, even when its threshold value becomes 0 V or less, by appropriately setting the potential of the signal line TG.

Figure 17:
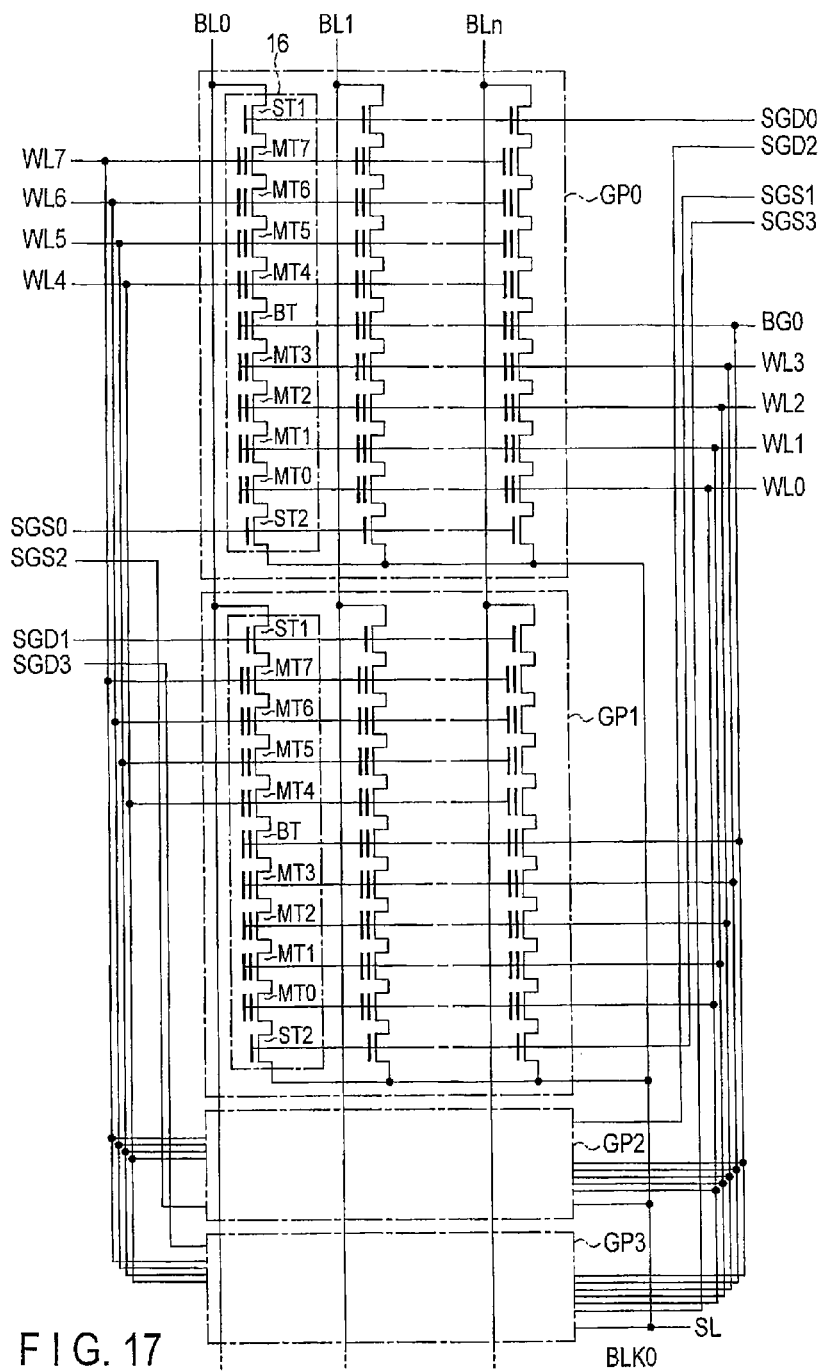
FIG. 17 is a circuit diagram of a memory cell array according to a modification of the first and second embodiments.

The memory cell array shown in FIG. 2 may also have an arrangement as shown in FIG. 17. FIG. 17 is a circuit diagram of the block BLK0, and the blocks BLK1 to BLK3 can have the same arrangement. As shown in FIG. 17, the word lines WL0 to WL3, backgate line BG, even-numbered select gate lines SGD0 and SGD2, and odd-numbered select gate lines SGS1 and SGS3 are extracted to one side of the memory cell array 10. On the other hand, the word lines WL4 to WL7, even-numbered select gate lines SGS0 and SGS2, and odd-numbered select gate lines SGD1 and SGD3 are extracted to the other side of the memory cell array 10, which is opposite to the above-mentioned one side. An arrangement like this is also possible.

In this arrangement, it is possible to divide the row decoder 11 into two row decoders, and arrange them such that they oppose each other with the memory cell array 10 being sandwiched between them. In this arrangement, one row decoder can select the select gate lines SGD0, SGD2, SGS1, and SGS3, word lines WL0 to WL3, and backgate line BG, and the other row decoder can select the select gate lines SGS0, SGS2, SGD1, and SGD3, and word lines WL4 to WL7. This arrangement can reduce the complexity of interconnections such as the select gate lines and word lines in the region (including the row decoder 11) between the driver circuit 12 and memory cell array 10.

Moreover, in each of the above embodiments, the semiconductor memory device is explained by taking a three-dimensionally stacked NAND flash memory as an example. However, the three-dimensionally stacked NAND flash memory is not limited to the arrangement shown in FIGS. 3, 4, and 5. For example, the semiconductor layer 26 need not have a U-shape, and can also be a single pillar. In this arrangement, the transistor BT is unnecessary. Also, the embodiments are applicable not only to the three-dimensionally stacked memory, but also to, e.g., a conventional NAND flash memory in which memory cells are two-dimensionally arranged in the plane of a semiconductor substrate. Furthermore, each embodiment is explained by taking the operation in which data is erased for each block BLK as an example, but the present embodiments are not limited to this. As an example, data may also be erased for a plurality of NAND strings 16.

Further, the timing of applying VBB to the unselected select gate lines is not limited to the case shown in FIG. 13 and FIG. 15, and can be modified. For example, when the semiconductor memory device is powered-on, the voltage generator 14 may start and continue a generating VBB. In this case, VBB may be constantly applied to the unselected select gate lines. As a result, in FIG. 13 and FIG. 15, resetting the potential of the unselected select gate lines to VSS at the start and the end of the operations is not necessary for every operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory string including a first plurality of memory cells and a first selection transistor;
a first line coupled to a gate of the first selection transistor; and
a row decoder including a block decoder, a first transistor, and a second transistor, a first output terminal of the block decoder being coupled to a gate of the first transistor, a second output terminal of the block decoder being coupled to a gate of the second transistor, the first transistor and the second transistor being a high-withstand-voltage and enhancement type transistor, a first terminal of the first transistor being coupled to the first line, a first terminal of the second transistor being coupled to the first line, a negative voltage being capable of being applied to back gates of the first transistor and the second transistor.

2. The device according to claim 1, further comprising:
a second memory string including a second plurality of memory cells and a second selection transistor;
a second line coupled to the gate of the second selection transistor; and
a circuit configured to apply, in data write or read, a positive voltage to the first line, the circuit being configured to apply a negative voltage to the second line.

3. The device according to claim 1, wherein the block decoder includes:
a third transistor coupled to the first output terminal, the third transistor being a high-withstand-voltage and a depletion type transistor; and
a fourth transistor coupled to the third transistor, the fourth transistor being a low-withstand-voltage and a depletion type transistor.

4. The device according to claim 3, further comprising:
a level shifter coupled to the fourth transistor.

5. The device according to claim 3, wherein
a negative voltage is capable of being applied to back gates of the third transistor and the fourth transistor.

6. The device according to claim 1, wherein
the first transistor is formed in a second-conductivity-type first semiconductor region, the first semiconductor region is formed in a surface of a first-conductivity-type second semiconductor region, the second semiconductor region is formed in a surface of a second-conductivity-type third semiconductor region, and the negative voltage is applied to the first semiconductor region in data write and read.

7. The device according to claim 1, wherein the first selection transistor has a negative threshold value.

8. The device according to claim 1, wherein
a threshold value of a memory cell in a written state is higher than that in an erased state, and the threshold value of the memory cell in the erased state is a positive value.

9. A semiconductor memory device comprising:
a plurality of first memory cells stacked above a semiconductor substrate;
a selection transistor;
a first memory string in which the first memory cells and the selection transistor are connected in series;
a word line coupled to a control gate;
a select gate line coupled to a gate of the selection transistor;
a bit line coupled to the first memory cells; and
a row decoder including a block decoder, a first transistor, and a second transistor, a first output terminal of the block decoder being coupled to a gate of the first transistor, a second output terminal of the block decoder being coupled to a gate of the second transistor, the first transistor and the second transistor being a high-withstand-voltage and enhancement type transistor, a first terminal of the first transistor being coupled to the first line, a first terminal of the second transistor being coupled to the first line, a negative voltage being capable of being applied to back gates of the first transistor and the second transistor.

10. The device according to claim 9, further comprising:
a second memory string including a second plurality of memory cells and a second selection transistor;
a second line coupled to the gate of the second selection transistor; and
a circuit configured to apply, in data write or read, a positive voltage to the first line, the circuit being configured to apply a negative voltage to the second line.

11. The device according to claim 9, wherein the block decoder includes;
a third transistor coupled to the first output terminal, the third transistor being a high-withstand-voltage and a depletion type transistor; and
a fourth transistor coupled to the third transistor, the fourth transistor being a low-withstand-voltage and a depletion type transistor.

12. The device according to claim 11, further comprising:
a level shifter coupled to the fourth transistor.

13. The device according to claim 11, wherein
a negative voltage is capable of being applied to back gates of the third transistor and the fourth transistor.

14. The device according to claim 9, wherein
the first transistor is formed in a second-conductivity-type first semiconductor region, the first semiconductor region is formed in a surface of a first-conductivity-type second semiconductor region, the second semiconductor region is formed in a surface of a second-conductivity-type third semiconductor region, and the negative voltage is applied to the first semiconductor region in data write and read.

15. The device according to claim 9, wherein the first selection transistor has a negative threshold value.

16. The device according to claim 9, wherein
a threshold value of a memory cell in a written state is higher than that in an erased state, and the threshold value of the memory cell in the erased state is a positive value.

* * * * *